United States Patent
Nakashiba et al.

(10) Patent No.: US 9,305,253 B2
(45) Date of Patent: Apr. 5, 2016

(54) INTERFACE IC AND MEMORY CARD INCLUDING THE SAME

(71) Applicant: Renesas Electronics Corporation, Kawasaki-shi (JP)

(72) Inventors: Yasutaka Nakashiba, Kawasaki (JP); Hiroaki Ohkubo, Kawasaki (JP); Mitsuji Okada, Kawasaki (JP); Shigeharu Nakata, Kawasaki (JP); Shuuichi Kagawa, Kawasaki (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 53 days.

(21) Appl. No.: 13/964,446

(22) Filed: Aug. 12, 2013

(65) Prior Publication Data

US 2013/0327838 A1    Dec. 12, 2013

Related U.S. Application Data

(63) Continuation of application No. 12/923,928, filed on Oct. 14, 2010, now Pat. No. 8,534,563.

(30) Foreign Application Priority Data

Oct. 15, 2009    (JP) ................................. 2009-238173

(51) Int. Cl.
*G06K 19/06* (2006.01)
*G06K 19/073* (2006.01)
*G11C 7/24* (2006.01)
*H03K 19/0175* (2006.01)

(52) U.S. Cl.
CPC ................ *G06K 19/073* (2013.01); *G11C 7/24* (2013.01); *H03K 19/017509* (2013.01)

(58) Field of Classification Search
USPC ......... 235/492, 451; 361/736, 737; 340/572.7
See application file for complete search history.

(56) References Cited

U.S. PATENT DOCUMENTS

| | | |
|---|---|---|
| 6,840,443 B2 | 1/2005 | Azumi |
| 2006/0063506 A1 | 3/2006 | Miwa et al. |
| 2006/0151614 A1 | 7/2006 | Nishizawa et al. |
| 2007/0063920 A1 | 3/2007 | Shionoiri et al. |
| 2008/0093454 A1 | 4/2008 | Yamazaki et al. |

FOREIGN PATENT DOCUMENTS

| | | |
|---|---|---|
| CN | 101271538 A | 9/2008 |
| JP | 4-023092 A | 1/1992 |
| JP | 8-147079 | 6/1996 |

(Continued)

OTHER PUBLICATIONS

Japanese Notification of Reasons for Refusal dated May 28, 2013, with English-language translation.

(Continued)

*Primary Examiner* — Ahshik Kim
(74) *Attorney, Agent, or Firm* — McGinn IP Law Group, PLLC

(57) ABSTRACT

A memory card includes a memory that stores data, a driver that transmits the data received from the memory, and at least one transmitter that transmits the data received from the driver to a receiver provided in an external main unit. The driver and the at least one transmitter are provided in a single IC (integrated circuit) chip and are not overlapped with each other in a planar view.

17 Claims, 6 Drawing Sheets

(56) References Cited

FOREIGN PATENT DOCUMENTS

| JP | 2000-215681 | 8/2000 |
| JP | 2002-216093 A | 8/2002 |
| JP | 2006085548 A | 3/2006 |
| JP | 2008-283172 | 11/2008 |

OTHER PUBLICATIONS

Chinese Office Action dated Apr. 28, 2014, with English translation.
Chinese Office Action dated Sep. 26, 2014 with an English Translation thereof.

INTERFACE IC AND MEMORY CARD INCLUDING THE SAME

INCORPORATION BY REFERENCE

The present application is a Continuation Application of U.S. patent application Ser. No. 12/923,928, filed on Oct. 14, 2010, which is based on and claims priority from Japanese Patent Application No. 2009-238173, filed on Oct. 15, 2009, the entire contents of which is incorporated herein by reference.

BACKGROUND

1. Field of the Invention

The present invention relates to an interface IC and a memory card including the same.

2. Description of Related Art

Memory cards having a flash memory built therein are widely used as storage media for use in a portable game machine, a digital camera, an IC recorder, a cellular phone, or the like. FIG. 5 is a plan view showing an internal structure of a typical contact type memory card.

The memory card shown in FIG. 5 includes a printed circuit board 1, a flash memory 2 that stores data, data pins 3 that are external terminals for data transfer, a power supply pin 4a that connects to a power supply, a ground pin 4b that connects to ground, and wiring lines 5. In the memory card of FIG. 5, data is transferred to a main unit, into which the memory card is inserted, through the data pins 3.

In the contact type memory card using such data pins, a contact failure may occur. In this regard, Japanese Unexamined Patent Application Publication No. 8-147079 discloses a non-contact type memory card using magnetic coupling of coils in place of the data pins.

As a related art, Japanese Unexamined Patent Application Publication No. 2008-283172 discloses a semiconductor device for RFID (Radio Frequency Identification) in which an antenna is integrated with an IC. Further, Japanese Unexamined Patent Application Publication No. 2000-215681 discloses a mask ROM (Read Only Memory) having a scrambling device.

SUMMARY

The present inventors have found problems as described below. In the contact type memory card shown in FIG. 5, the data stored in the flash memory 2 may be easily read out by contacting a probe to the data pins 3, for example. This may cause a problem that even if game software used for a portable game machine is encrypted and stored in a memory card, for example, it is easily read out and cryptanalyzed by a so-called hacker or the like. In short, such game software has low tamper resistance. Further, such a contact type memory card shown in FIG. 5 is composed of commercial parts. Therefore, illegal copies (so-called "pirated copies") of the cryptanalyzed game software can easily be made.

A first exemplary aspect of the present invention is a memory card that includes a memory that stores data, a driver that transmits the data received from the memory, and at least one transmitter that transmits the data received from the driver to a receiver provided in an external main unit, wherein the driver and the at least one transmitter are provided in a single IC (integrated circuit) chip and are not overlapped with each other in a planar view.

The at least one transmitter can include a coil. The at least one transmitter can include a plurality of transmitters. The plurality of transmitters can transmit the data to the receiver alternately. The plurality of transmitters transmit the data to the receiver randomly. The memory card can further include a clock receiver that receives a clock signal from the external main unit. A size of the at least one transmitter differs from a size of the clock receiver. The memory card can include an encrypting circuit that encrypts the data received from the memory and transmits the encrypted data to the driver. The encrypting circuit can be provided in the IC chip. The memory can be provided in the IC chip. The data stored in the memory can be a game software.

Another exemplary aspect of the present invention is an interface IC (integrated circuit) provided in a memory card so as to transmit data from the memory card to a main unit into which the memory card is inserted, the interface IC including a driver that transmits the data received from a memory of the memory card, and at least one transmitter that transmits the data received from the driver to a receiver provided in the main unit, wherein the driver and the at least one transmitter are provided in a single IC chip and are not overlapped with each other in a planar view.

The at least one transmitter can include a coil. The at least one transmitter can include a plurality of transmitters. The plurality of transmitters can transmit the data to the receiver alternately. The plurality of transmitters can transmit the data to the receiver randomly. The interface IC can further include a clock receiver that receives a clock signal from the main unit and is provided in the IC chip. A size of the at least one transmitter can differ from a size of the clock receiver.

In the exemplary aspects of the present invention, the driver and the transmitter are provided in a single IC chip. This makes it possible to increase the tamper resistance and to prevent illegal copies.

According to the exemplary aspects of the present invention, it is possible to provide a memory card capable of increasing the tamper resistance and preventing illegal copies.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments of the present invention will be described in detail below with reference to the accompanying drawings. Note that the present invention is not limited to exemplary embodiments described below. The following description and the accompanying drawings are appropriately simplified to clarify the explanation.

First Exemplary Embodiment

Figure 1A:
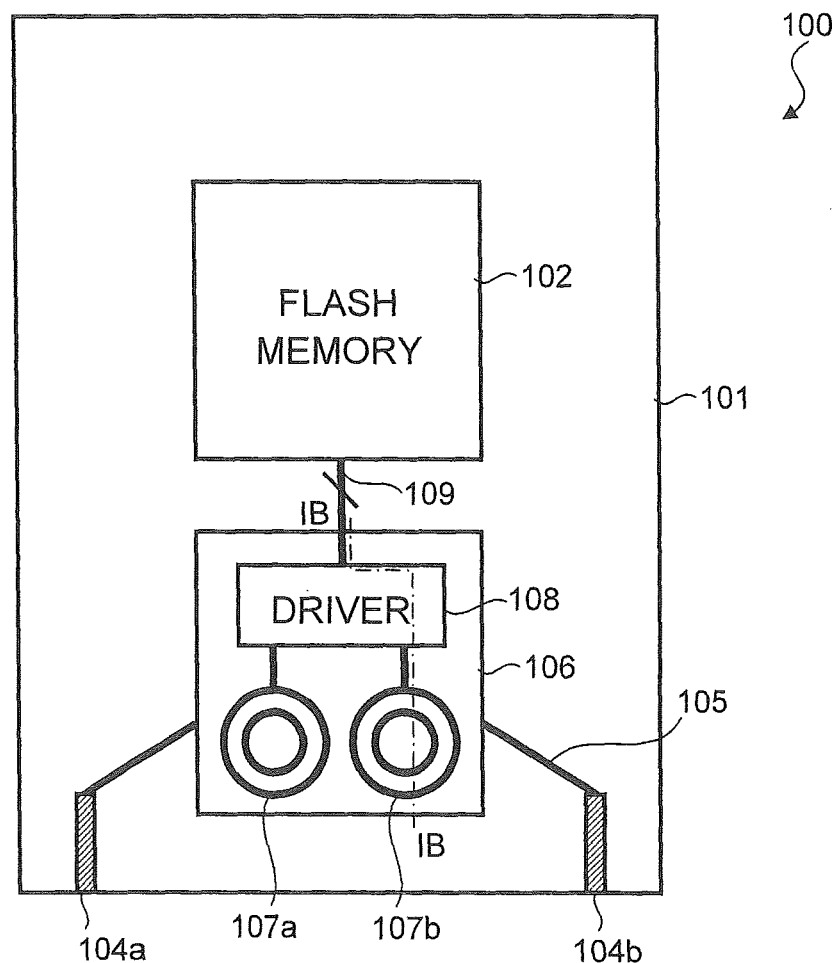
FIG. 1A is a plan view showing an internal structure of a memory card according to a first exemplary embodiment.
Figure 1A:
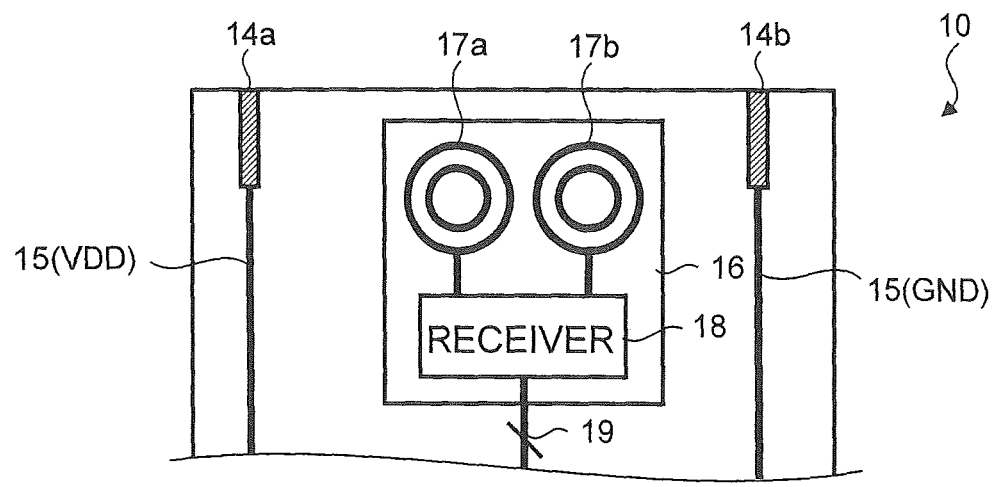

FIG. 1A is a plan view showing an internal structure of a memory card according to a first exemplary embodiment of the present invention. A memory card 100 shown in FIG. 1A is a memory card that stores game software for a portable game machine, for example. The memory card 100 shown in FIG. 1A includes a printed circuit board 101, a flash memory 102, a power supply pin 104a, a ground pin 104b, a wiring line 105, an interface IC 106, a clock receiving coil 107a, a data transmitting coil 107b, a driver 108, and a bus 109.

On the other hand, a main unit 10 that corresponds to a portable game machine, for example, includes a power supply pin 14a, a ground pin 14b, wiring lines 15, an interface IC 16, a clock transmitting coil 17a, a data receiving coil 17b, a receiver 18, and a bus 19.

The flash memory 102 is an independent IC chip provided on the printed circuit board 101. The flash memory 102 stores game software for a portable game machine, for example.

The power supply pin 104a for connecting to a power supply and the ground pin 104b for connecting to ground are metal terminals composed of a copper alloy, for example. The power supply pin 104a and the ground pin 104b are provided on the printed circuit board 101. When the memory card 100 is inserted into the main unit 10, the power supply pin 104a and the ground pin 104b contact and electrically connect to the power supply pin 14a and the ground pin 14b of the main unit 10, respectively. Therefore, a power supply voltage VDD and a ground voltage GND are applied to the power supply pin 104a and the ground pin 104b, respectively, through the main unit 10.

Here, coils connecting for a power supply/ground may be provided in place of the power supply pin 104a and the ground pin 104b. However, the use of the power supply pin 104a and the ground pin 104b provides more stable voltages.

The interface IC 106 is an independent IC chip provided on the printed circuit board 101. To the interface IC 106, the power supply voltage VDD and the ground voltage GND are applied through the wiring line 105 formed on the printed circuit board 101. On the interface IC 106, the clock receiving coil 107a, the data transmitting coil 107b, and the driver 108 are formed.

The clock receiving coil 107a and the data transmitting coil 107b are composed of spiral wiring patterns formed on the surface of the interface IC 106. When the memory card 100 is inserted into the main unit 10, the clock receiving coil 107a and the data transmitting coil 107b are magnetically connected, in a non-contact manner, to the clock transmitting coil 17a and the data receiving coil 17b of the main unit 10 at a distance of about 3 mm, respectively. Note that the clock receiving coil 107a is not necessarily provided if data transfer is performed without synchronizing the clock.

The clock receiving coil 107a receives the clock from the main unit 10. Meanwhile, the data stored in the flash memory 102 is transmitted to the main unit 10 through the data transmitting coil 107b and the data receiving coil 17b. Note that the data received through the data receiving coil 17b is demodulated and serial/parallel-converted by the receiver 18 formed on the interface IC 16 of the main unit 10. Then, the data is stored to a RAM (Random Access Memory) of the main unit 10 through the bus 19. The RAM is not illustrated.

The driver 108 is a drive circuit formed on the interface IC 106. The driver 108 receives the parallel data stored in the flash memory 102 through the bus 109 formed on the printed circuit board 101. Then, the driver 108 parallel/serial-converts and modulates the data received from the flash memory 102 according to the clock received through the clock receiving coil 107a, and transmits the data to the data transmitting coil 107b.

Figure 1B:
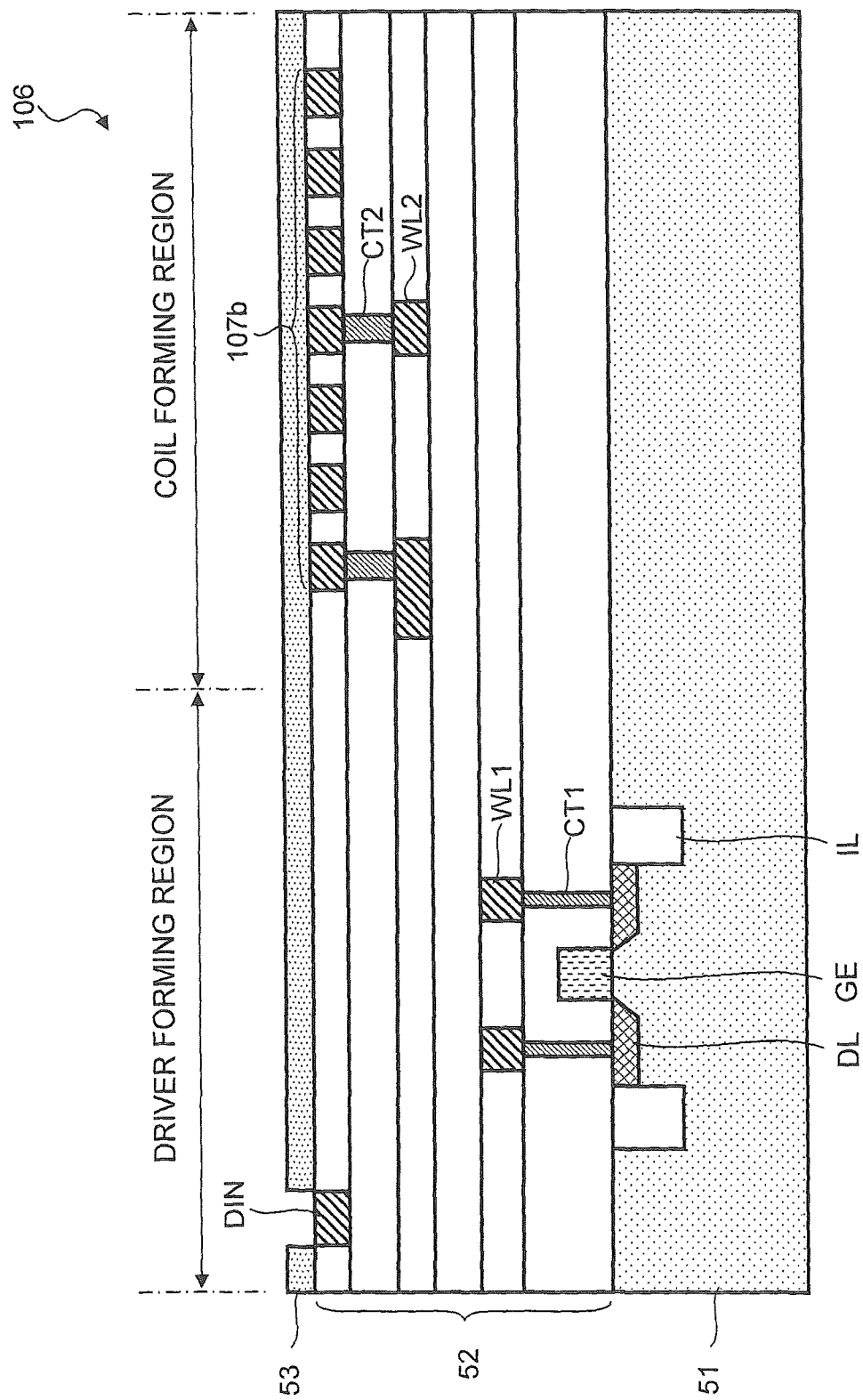
FIG. 1B is a cross-sectional view of an interface IC 106.

FIG. 1B is a cross-sectional view of the interface IC 106 taken along the line IB-IB of FIG. 1A. The right side of FIG. 1B shows a coil forming region in which the clock receiving coil 107a and the data transmitting coil 107b are formed. The left side of FIG. 1B shows a driver forming region in which the driver 108 is formed. As shown in FIG. 1B, the interface IC 106 has a layer structure that includes a semiconductor substrate 51 composed of silicon, for example, a wiring multilayer 52, and a surface insulation film 53.

In the driver forming region, a MOS transistor that constitutes the driver 108 is formed. The MOS transistor has two diffusion regions (a source region and a drain region) DL formed in the semiconductor substrate 51, and a gate electrode GE formed on the semiconductor substrate 51 between the two diffusion regions DL. The gate electrode GE is composed of a polysilicon layer, for example. The two diffusion regions DL connect to wiring lines WL1 through contacts CT1, respectively. An isolation layer IL is formed around the MOS transistor. At an end of the driver forming region, the surface insulation film 53 is removed, and a data input terminal DIN is formed in the uppermost layer of the wiring multilayer 52.

In the coil forming region, the clock receiving coil 107a and the data transmitting coil 107b are formed in the uppermost layer of the wiring multilayer 52. The data transmitting coil 107b is shown in FIG. 1B. Both ends of the data transmitting coil 107b having a spiral shape connect to wiring lines WL2 through contacts CT2, respectively.

The memory card 100 according to the first exemplary embodiment prevents the data stored therein from being easily illegally cryptanalyzed and has a more excellent tamper resistance than a contact type one, because the memory card 100 is a non-contact type with the data transmitting coil 107b. Further, the interface IC 106 in which the data transmitting coil 107b is formed is a dedicated part of the memory card 100. This makes it extremely difficult to duplicate the data stored in the memory card 100 and makes it possible to prevent illegal copies from being made.

Figure 2:
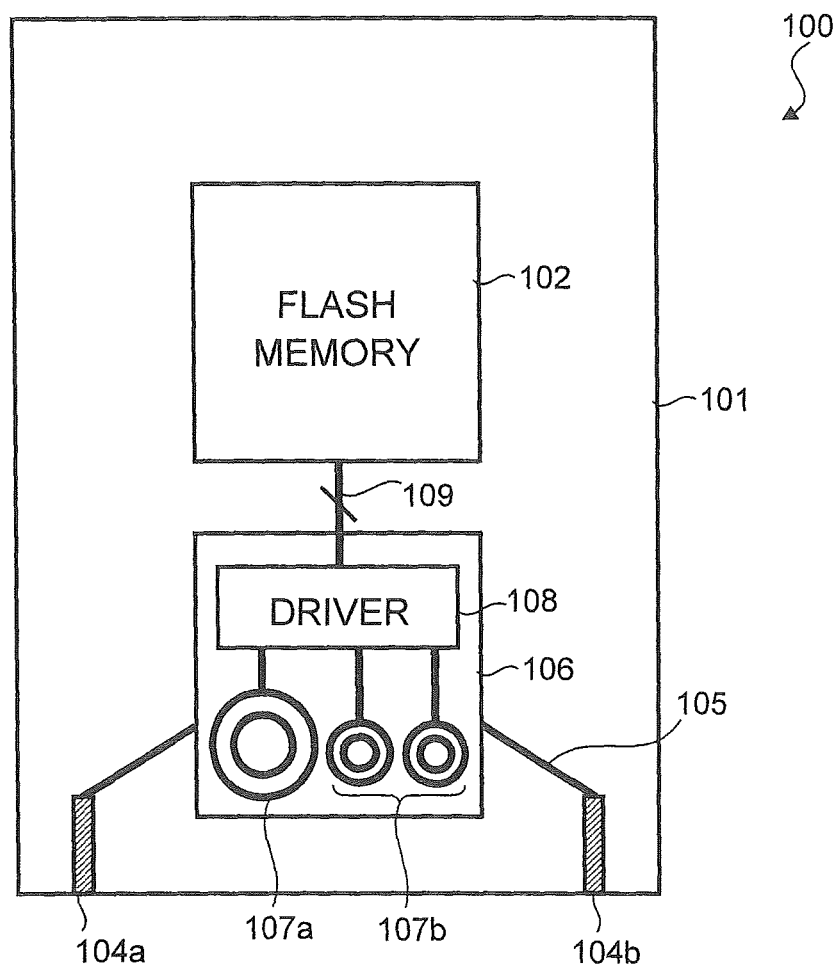
FIG. 2 is a plan view showing an internal structure of a variant of the memory card according to the first exemplary embodiment.

FIG. 2 is a plan view showing an internal structure of a variant of the memory card according to the first exemplary embodiment. As shown in FIG. 2, a plurality of data transmitting coils 107b may be provided. Further, as shown in FIG. 2, it is possible to increase the tamper resistance by transmitting the data using two data transmitting coils 107b alternately or randomly. Note that the size of the data transmitting coil 107b may differ from the size of the clock receiving coil 107a. Specifically, the data transmitting coil 107b may be smaller than the clock receiving coil 107a.

Figure 3:
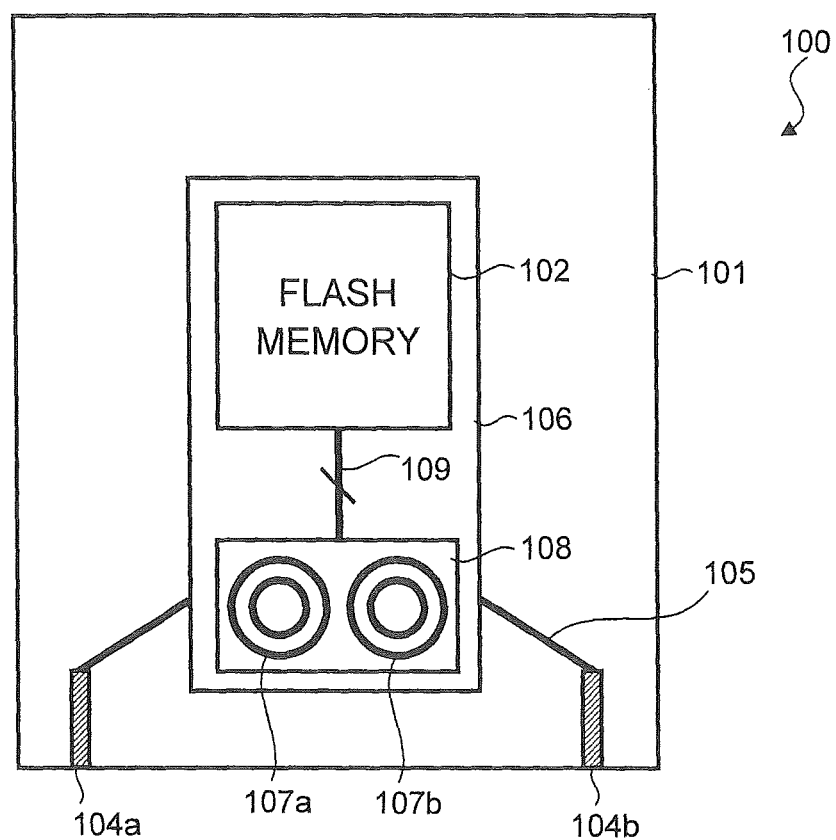
FIG. 3 is a plan view showing an internal structure of another variant of the memory card according to the first exemplary embodiment.

FIG. 3 is a plan view showing an internal structure of another variant of the memory card according to the first exemplary embodiment. As shown in FIG. 3, the flash memory 102, the data transmitting coil 107b, the clock receiving coil 107a, and the driver 108 may be formed on the interface IC 106. In other words, the interface IC 106 and the flash memory 102 shown in FIG. 1A may be formed on a single IC chip. This makes it difficult to duplicate the data stored in the memory card 100 and makes it possible to prevent illegal copies from being made.

Further, as shown in FIG. 3, the data transmitting coil 107b and the clock receiving coil 107a may be formed on the driver 108. This configuration allows downsizing.

Second Exemplary Embodiment

Figure 4:
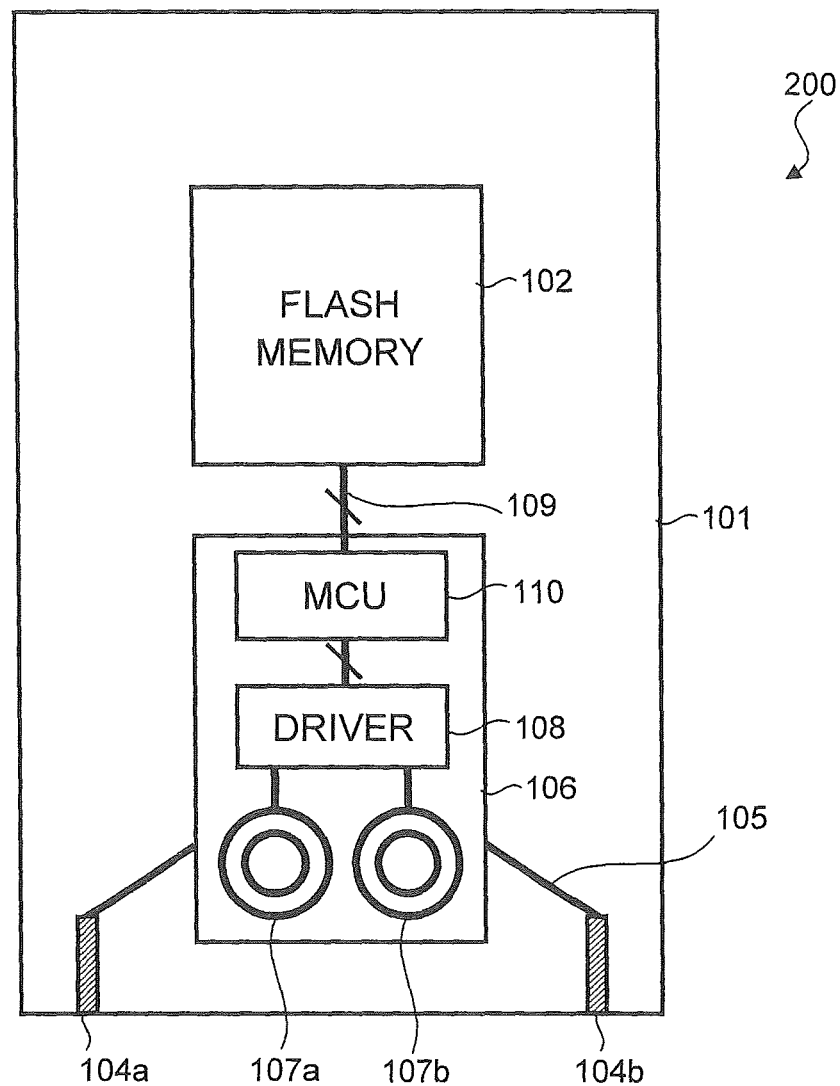
FIG. 4 is a plan view showing an internal structure of a memory card according to a second exemplary embodiment.
Figure 5:
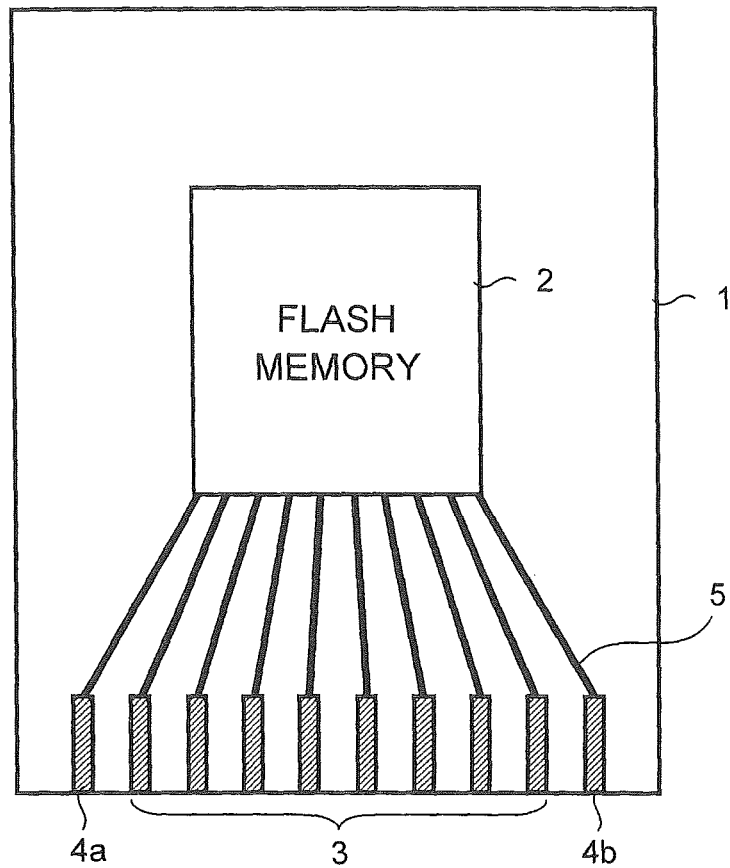
FIG. 5 is a plan view showing an internal structure of a typical contact type memory card.

Next, a second exemplary embodiment of the present invention is described hereinafter with reference to FIG. 4. FIG. 4 is a plan view showing an internal structure of a memory card according to a second exemplary embodiment. As shown in FIG. 4, the memory card 200 according to the second exemplary embodiment has an MCU 110 provided between the driver 108 and the flash memory 102 in the memory card 100 according to the first exemplary embodiment shown in FIG. 1A. Other structures are similar to those in the first exemplary embodiment, and thus description thereof will be omitted.

The MCU (Memory Control Unit) 110 is a control circuit that controls the flash memory 102. The MCU 110 is formed on the interface IC 106. The MCU 110 receives the parallel data stored in the flash memory 102 through the bus 109. Then, the MCU 110 encrypts the data received from the flash memory 102 according to the clock received through the clock receiving coil 107a, and transmits the data to the driver. In short, the MCU 110 according to the second exemplary embodiment has a function as an encrypting circuit. This further improves the tamper resistance.

Note that capacitor coupling (electrostatic coupling) or an extremely short distance radio communication using an antenna coil may be used in place of the coil coupling (magnetic coupling). Here, the signal transmission distance in the magnetic coupling is about 1 to 3 mm. On the other hand, the signal transmission distance in the extremely short distance radio communication is about 10 mm. Therefore, the magnetic coupling has less transmission errors. Further, the magnetic coupling prevents data from being intercepted and has a more excellent tamper resistance.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A memory card comprising:
   a memory that stores data;
   a driver that transmits the data received from the memory;
   at least one transmitter that transmits the data received from the driver to a receiver provided in an external main unit,
   wherein the driver and the at least one transmitter are provided in a single IC (integrated circuit) chip and are not overlapped with each other in a planar view; and
   a clock receiver that receives a clock signal from the external main unit,
   wherein a size of the at least one transmitter differs from a size of the clock receiver.

2. The memory card according to claim 1, wherein the at least one transmitter comprises a coil.

3. The memory card according to claim 1, wherein the at least one transmitter comprises a plurality of transmitters.

4. The memory card according to claim 3, wherein the plurality of transmitters transmit the data to the receiver alternately.

5. The memory card according to claim 3, wherein the plurality of transmitters transmit the data to the receiver randomly.

6. The memory card according to claim 1, further comprising an encrypting circuit that encrypts the data received from the memory and transmits the encrypted data to the driver.

7. The memory card according to claim 6, wherein the encrypting circuit is provided in the IC chip.

8. The memory card according to claim 1, wherein the memory is provided in the IC chip.

9. The memory card according to claim 1, wherein the data stored in the memory comprises a game software.

10. The memory card according to claim 1, wherein the driver is not overlapping by being stacked above the at least one transmitter in a planar view.

11. An interface IC (integrated circuit) provided in a memory card so as to transmit data from the memory card to a main unit into which the memory card is inserted, the interface IC comprising:
    a driver that transmits the data received from a memory of the memory card;
    at least one transmitter that transmits the data received from the driver to a receiver provided in the main unit,
    wherein the driver and the at least one transmitter are provided in a single IC chip and are not overlapped with each other in a planar view; and
    a clock receiver that receives a clock signal from the main unit and is provided in the IC chip.

12. The interface IC according to claim 11, wherein the at least one transmitter comprises a coil.

13. The interface IC according to claim 11, wherein the at least one transmitter comprises a plurality of transmitters.

14. The interface IC according to claim 13, wherein the plurality of transmitters transmit the data to the receiver alternately.

15. The interface IC according to claim 13, wherein the plurality of transmitters transmit the data to the receiver randomly.

16. The interface IC according to claim 11, wherein a size of the at least one transmitter differs from a size of the clock receiver.

17. The interface IC according to claim 11, wherein the driver is not formed over the at least one transmitter in a planar view.

\* \* \* \* \*